United States Patent
Kittl et al.

(10) Patent No.: US 7,491,635 B2
(45) Date of Patent: Feb. 17, 2009

(54) METHOD FOR FORMING A FULLY SILICIDED GATE AND DEVICES OBTAINED THEREOF

(75) Inventors: Jorge Adrian Kittl, Waterloo (BE); Anne Lauwers, Aartselaar (BE); Anabela Veloso, Leuven (BE); Anil Kottantharyil, Leuven (BE); Marcus Johannes Henricus Van Dal, Leuven (BE)

(73) Assignees: Interuniversitair Microelektronica Centrum, Leuven (BE); Texas Instruments Incorporated, Dallas, TX (US); Koninklijke Philips Electronics, Eindhoven (NL)

( * ) Notice: Subject to any disclaimer, the term of this patent is extended or adjusted under 35 U.S.C. 154(b) by 363 days.

(21) Appl. No.: 11/484,439

(22) Filed: Jul. 11, 2006

(65) Prior Publication Data
US 2007/0015334 A1    Jan. 18, 2007

Related U.S. Application Data

(60) Provisional application No. 60/698,046, filed on Jul. 11, 2005.

(30) Foreign Application Priority Data
Dec. 9, 2005    (EP)    ................... 05447277

(51) Int. Cl.
*H01L 21/3205*    (2006.01)
(52) U.S. Cl. ............... 438/592; 438/664; 257/E21.622
(58) Field of Classification Search ........... 438/592, 438/657, 664; 257/E21.203, E21.622
See application file for complete search history.

(56) References Cited

U.S. PATENT DOCUMENTS

| 5,981,365 | A  | * | 11/1999 | Cheek et al. ............... 438/592 |
| 6,555,453 | B1 | * | 4/2003  | Xiang et al. ............... 438/581 |
| 6,599,831 | B1 |   | 7/2003  | Maszara et al. |
| 6,905,922 | B2 |   | 6/2005  | Lin et al. |
| 6,906,360 | B2 | * | 6/2005  | Chen et al. ................... 257/204 |
| 2001/0003056 | A1 |  | 6/2001  | Hashimoto et al. |

FOREIGN PATENT DOCUMENTS

| EP | 1463102 A2   | 9/2004 |
| EP | 1496541 A1   | 1/2005 |
| WO | 2004057659 A1 | 7/2004 |

OTHER PUBLICATIONS

Transistors with Dual Work Function Metal Gates by Single Full Silicidation (FUSI) of Polysilicon Gates, W.P. Maszara et al., AMD, Technology Research Group, 2002.

(Continued)

*Primary Examiner*—Chandra Chaudhari
(74) *Attorney, Agent, or Firm*—McDonnell Boehnen Hulbert & Berghoff LLP

(57) ABSTRACT

A method for manufacturing a MOSFET device with a fully silicided (FUSI) gate is described. This method may be used to prevent formation of shorts between the FUSI gate and a contact to a source and/or a drain region. In particular, the method discloses the formation of an expansion volume above a gate dielectric. The volume is designed to substantially contain the fully silicided gate.

10 Claims, 11 Drawing Sheets

OTHER PUBLICATIONS

Formation and Characterization of Transition-Metal Silicides, M.A. Nicolet et al., VLSJ Electronics: Microstructure Science, vol. 6, 1983, Chapter 6.

Anik, K.G. et al., "CMP-less Integration of fully Ni-silicided metal gates in FinFETs by Simultaneous Silicidation of the Source, Drain, and the Gate Using a Novel Dual Hard Mask Approach," VLSI Technology, 2005; Digest of Technical Papers; Kyoto, Japan, Jun. 14-16, 2005, Piscataway, NJ, IEEE, pp. 198-199, XP010818297.

Aoyama, T. et al., "Proposal of New HfSiON CMOS Fabrication Process (HAMDAMA) for Low Standby Power Device," Electron Devices Meeting, 2004; IEDM Technical Digest; IEEE International San Francisco, CA, Dec. 13-15, 2004, Piscataway, NJ, Dec. 13, 2004, pp. 95-98, XP010788705.

Kittl, J.A. et al., "Scalability of Ni FUSI Gate Processes: Phase and Vt Control to 30nm Gate Lengths," VLSI Technology, 2005, Digest of Technical Papers; Kyoto, Japan, Jun. 14-16, 2005, Piscataway, NJ, IEEE pp. 72-73, XP010818177.

Extended European Search Report in Application No. EP 05447277.4, Oct. 28, 2008.

* cited by examiner

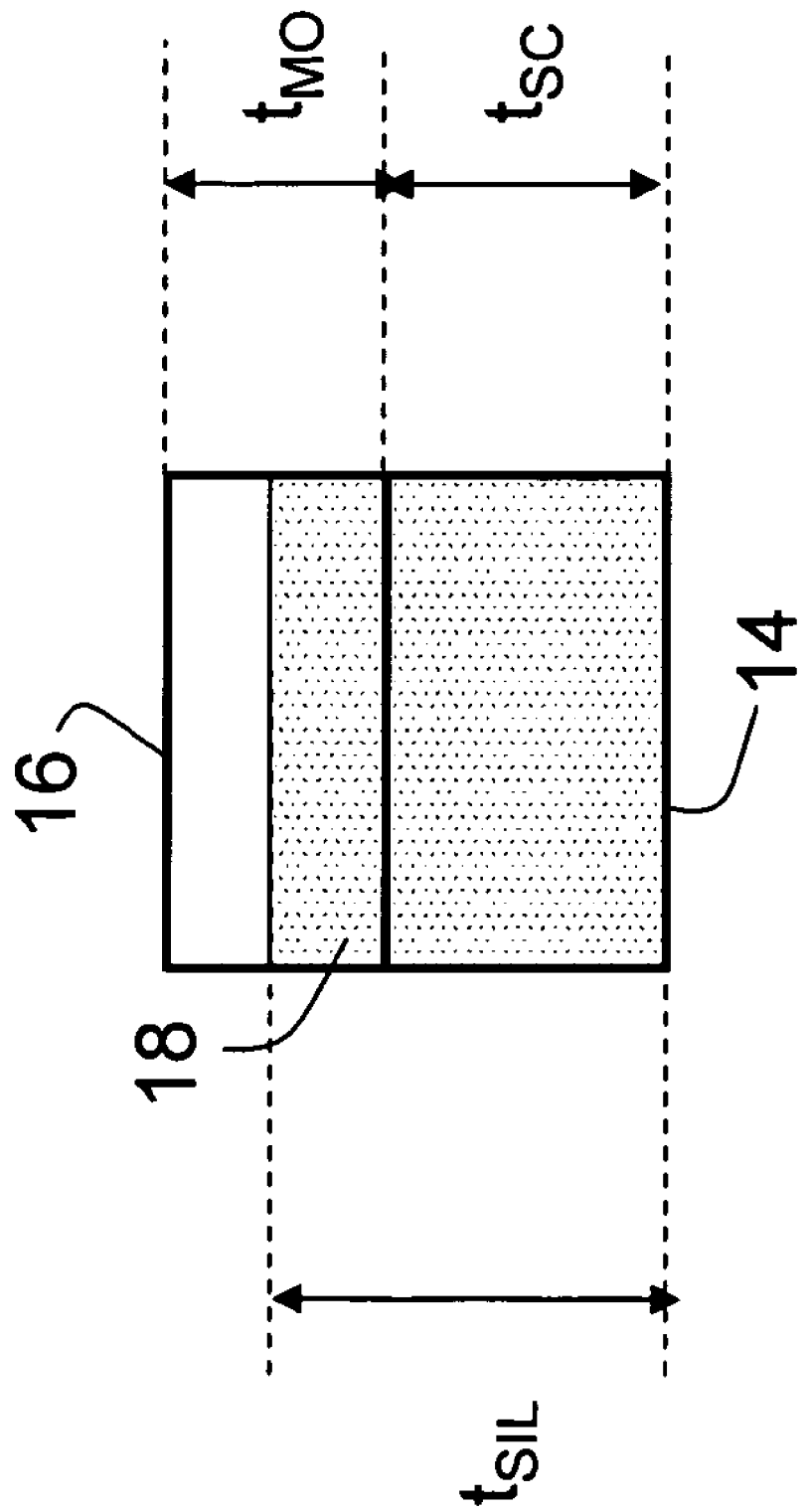

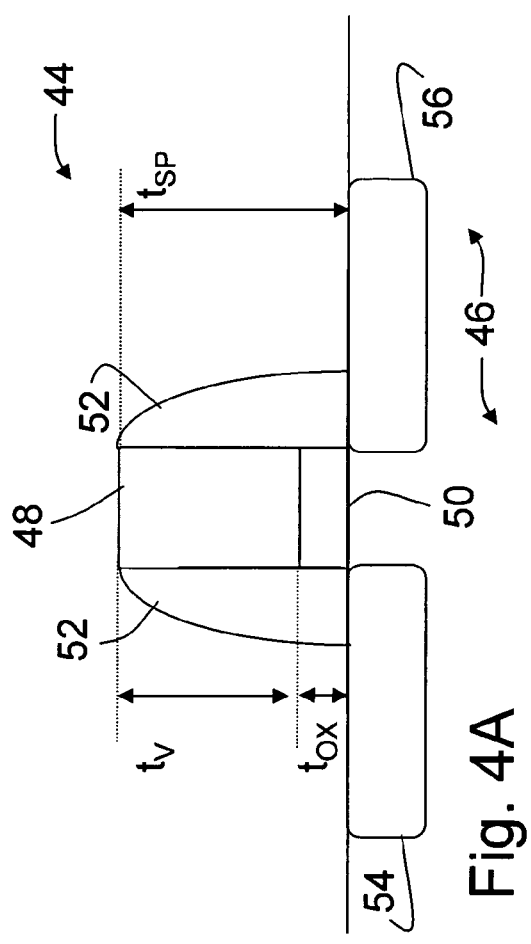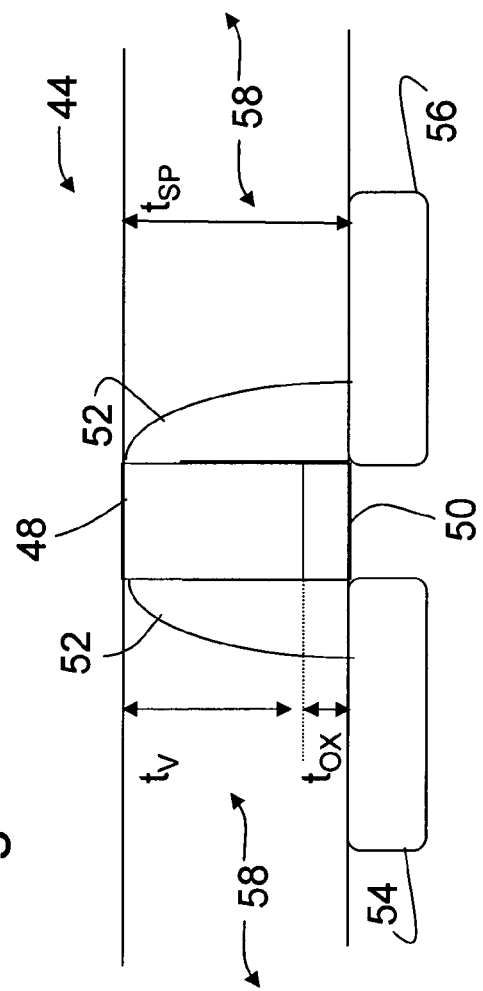

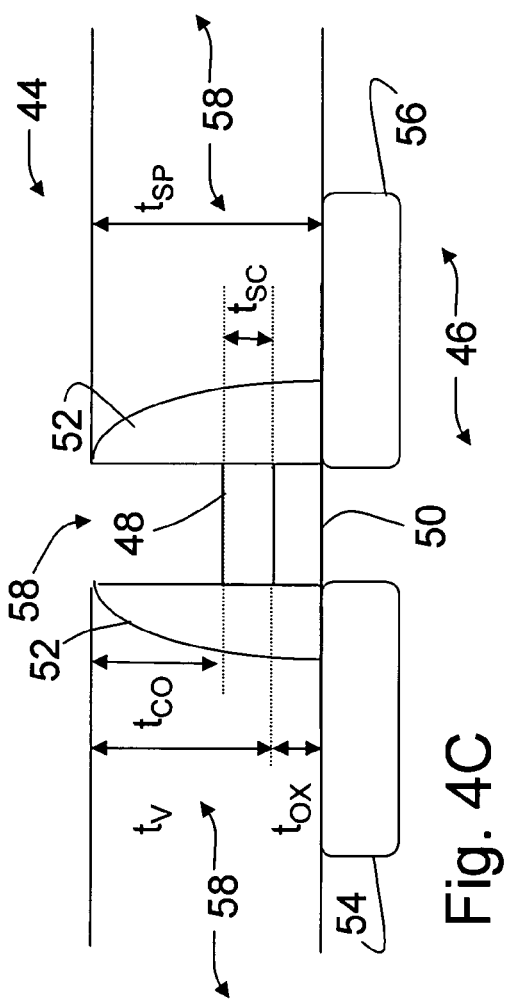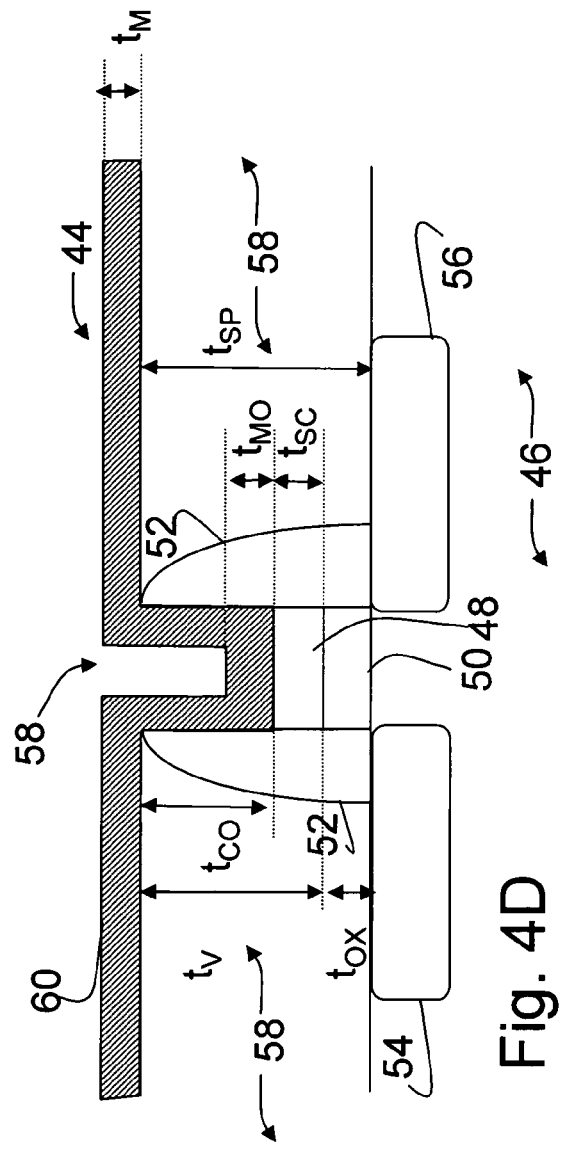
Fig. 4C
Fig. 4D

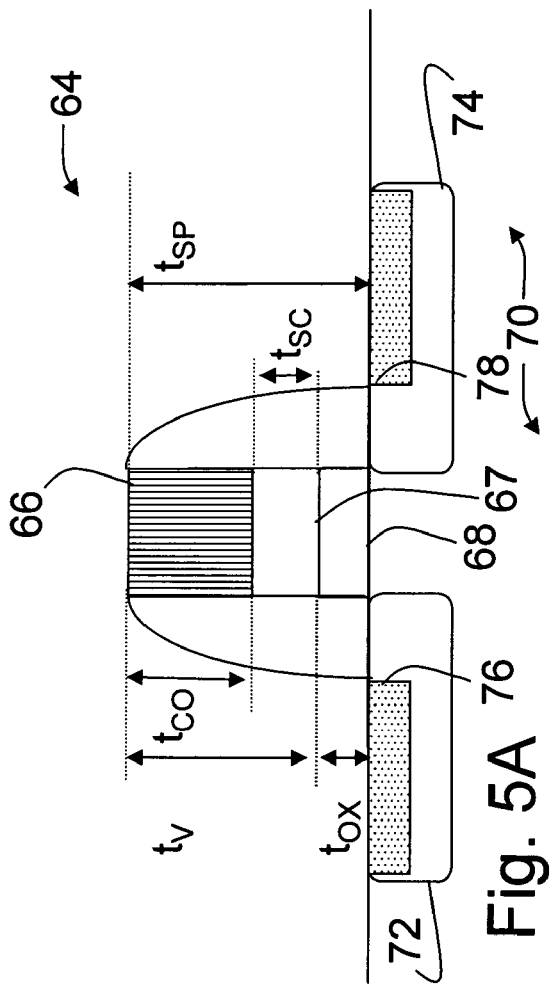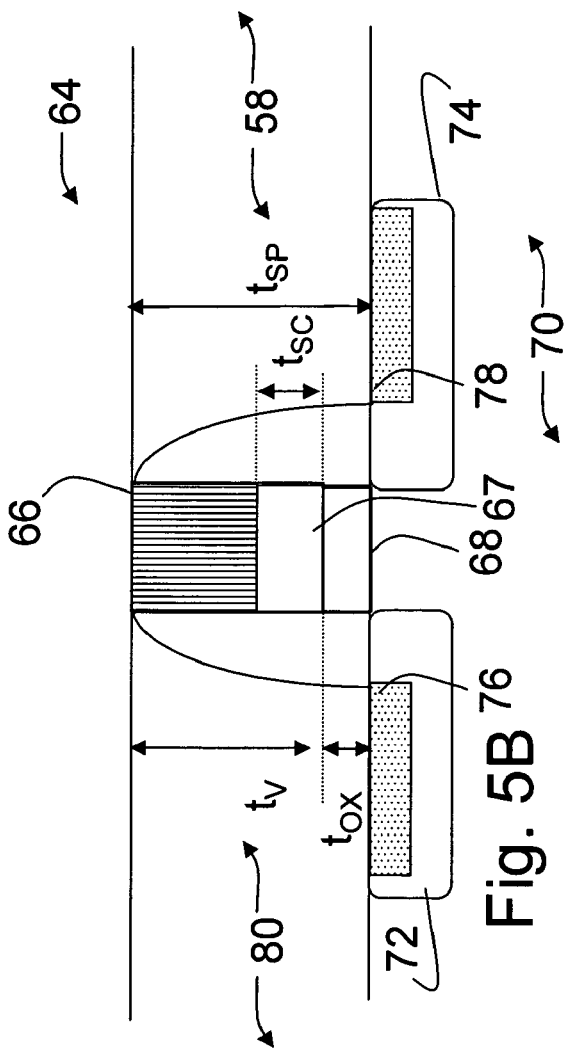

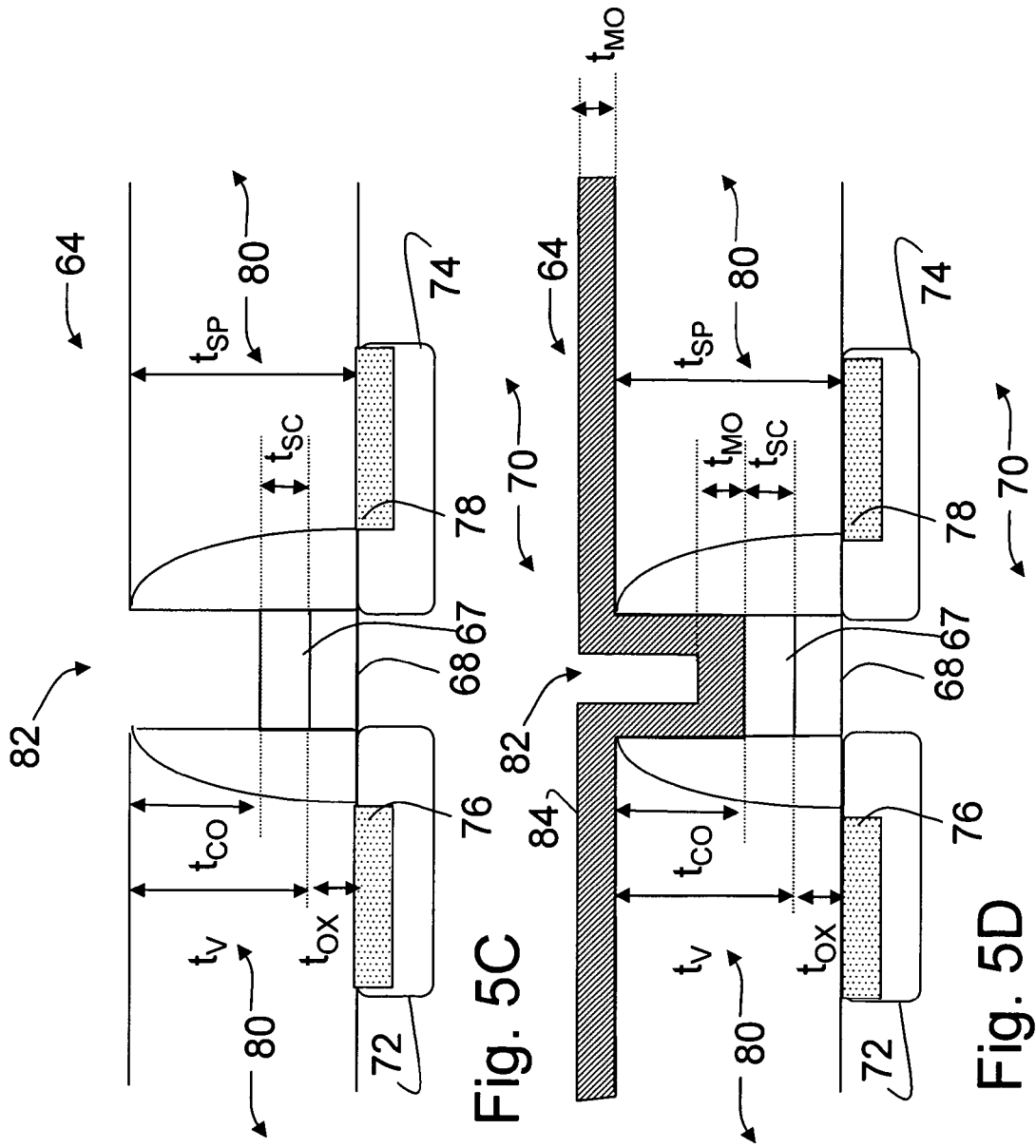

METHOD FOR FORMING A FULLY SILICIDED GATE AND DEVICES OBTAINED THEREOF

PRIORITY

The present application claims priority to the following U.S. filed provisional patent application: U.S. 60/698,046 filed Jul. 11, 2005 and the following European filed application EP 05447277.4 filed Dec. 9, 2005.

FIELD

The present invention relates to semiconductor process technology and devices. In particular, the present invention relates to semiconductor devices with metallic gate electrodes formed by a reaction between a metal and a semiconductor material.

BACKGROUND

MOSFET (Metal-Oxide-Silicon Field Effect Transistors) devices comprise a gate electrode, a gate dielectric, and a channel formed in or on a substrate. The gate dielectric dielectrically couples the channel to the gate electrode so that the gate electrode potential can modulate the conductivity of the channel. There is a trend to replace semiconductor gate electrodes with metal gate electrodes. Metal gate electrodes offer the advantages of reducing the sheet resistance, eliminating the semiconductor gate depletion effect, and controlling the work function independently from the doping of the junction regions.

Metal gate electrodes can be formed by full silicidation (FUSI) of the semiconductor gate electrode with a metal. The semiconductor gate electrode may be a polysilicon gate electrode. The metal may be a refractory metal such as tungsten (W), noble metals such as platinum (Pt), near noble metals such as nickel Ni, transition metals such as titanium (Ti), or any combination thereof. During this silicidation process, the gate electrode is converted into a silicide.

Various manufacturing methods and materials exist to form FUSI gate MOSFET devices using full silicidation of the semiconductor gate electrode. W. Maszara et al. discloses in "Transistors with Dual Work Function Metal Gates by Single Full Silicidation (FUSI) of Polysilicon gates," IEDM proceedings 2002 p367-370, the use of nickel-silicides to form a FUSI gate. According to this approach, the FUSI gate of a MOSFET device is formed during a single silicidation step using nickel as silicidation metal. The work function of the FUSI gate can be tuned by varying the thickness of the as-deposited nickel layer that will determine which nickel-silicide phase will be formed during silicidation.

U.S. Pat. No. 6,905,922, hereby incorporated by reference in its entirety, discloses a method for manufacturing FUSI gate MOSFET devices. According to this method, the MOSFET device, comprising a semiconductor gate electrode, source/drain regions and spacers alongside the gate electrode, is covered with a dielectric layer. By removing this dielectric layer from the semiconductor gate electrode, metal can be deposited on top of the semiconductor material to allow forming of the silicide.

As known from M. A. Nicolet et al in "VLSI electronics: Microstructure Science, Vol. 6," editors: N. G. Einspruch and G. B. Larrabee, Academic Press, New York, 1983, chapter 6, pages 455 to 459, when forming a silicide by the reaction between a semiconductor material and a metal, the volume occupied the silicide may be larger than the volume occupied by the semiconductor material, where the volume expansion is essentially a one-dimensional expansion and the thickness of the silicide layer is larger than the thickness of the as-deposited semiconductor layer.

SUMMARY

Unfortunately, when forming a fully silicided gate, the silicide might extend over the spacers, which can cause a short-circuit to form between a fully silicided gate electrode and contacts towards the source/drain regions. FIG. 1 shows a fully silicided gate electrode 4 and contacts 6. As seen in FIG. 1, the fully silicided gate 4 expands over spacers 8 and partially overlaps source 10 and/or drain 12 region(s). Hence, there is need for a low complexity method to manufacture a fully silicided gate MOSFET device that prevents short-circuiting of the gate electrode with the contacts to the source and/or drain region. Therefore, a method of manufacturing at least one MOSFET device having a fully silicided gate electrode is described.

In one example, a gate stack of a gate dielectric and a gate electrode is provided. The gate electrode has a thickness $t_V$ and is wrapped along its sidewalls by a dielectric layer. At least the portion of the gate electrode in contact with the gate dielectric is formed in a semiconductor material. A part of this gate electrode is removed to form a layer of the semiconductor material having a thickness $t_{SC}$. A layer comprising at least one silicidation metal is deposited on this semiconductor layer, and this semiconductor layer is fully silicided to form a silicide having a thickness $t_{SIL}$. The dimensions $t_V$ and $t_{SC}$ are selected according to the relationship $t_V \geq t_{SIL} = t_{SC}(1+b)$, with $(1+b)$ being the volume expansion factor of the silicide formed. The gate stack is formed by forming a gate electrode on a gate dielectric and sidewall spacers are formed lying against this gate stack. Preferably, the semiconductor material and the silicidation metal used to form the silicide are silicon and nickel, respectively.

In another example, the complete gate electrode is formed in a semiconductor material and a part of this gate electrode is removed by thinning the semiconductor material to the semiconductor layer having a thickness $t_{SC}$.

In another example, the gate electrode includes two portions. One portion is in contact with the gate electrode and is formed of a semiconductor material, which has a thickness $t_{SC}$. Another portion is not in contact with the gate dielectric and is formed in a material that can be selectively removed with respect to the semiconducting contact portion. This non-contacting portion is removed selectively such that the contact portion having a thickness $t_{SC}$ remains.

In another example, a method of manufacturing a MOSFET device having a fully silicided gate electrode is disclosed. The method includes providing a semiconducting gate having a thickness $t_{SC}$; forming a container having dielectric sidewalls on this semiconductor gate and aligned thereto, the container having a height $t_{CO}$; depositing a layer of at least one silicidation metal on this semiconductor gate; and fully siliciding the semiconductor gate, the silicide having a thickness $t_{SIL}$. The height $t_{CO}$ and thickness $t_{SC}$ are selected according to the relationship $t_{CO} \geq (t_{SC} b)$, with $t_{SIL}/t_{SC}=(1+b)$ being the volume expansion factor of the silicide formed.

In one example, the container can be formed by forming a semiconducting gate, having a thickness equal to or greater than $t_{SIL}$; forming sidewall spacers against this semiconducting gate; and thinning this semiconducting gate to obtain a semiconductor gate having a thickness $t_{SC}$. In another example, the container can be formed by stacking a material on top of the semiconductor gate that can be selectively removed with respect to the semiconducting gate; forming sidewall spacers against this layer stack; and removing the stacked portion to obtain a semiconductor gate having a thickness $t_{SC}$.

BRIEF DESCRIPTION OF THE DRAWINGS

Exemplary embodiments are illustrated in referenced figures of the drawings. It is intended that the embodiments and figures disclosed herein be considered illustrative rather than restrictive. Same numerals are used to refer to corresponding features in the drawings.

FIG. 2 schematically illustrates volume expansion associated with the formation of a silicide;

FIGS. 4A-E show schematic cross-sections illustrating a process flow, according to an example; and FIGS. 5A-E show schematic cross-sections illustrating a process flow, according to another example.

DETAILED DESCRIPTION

Figure 1:
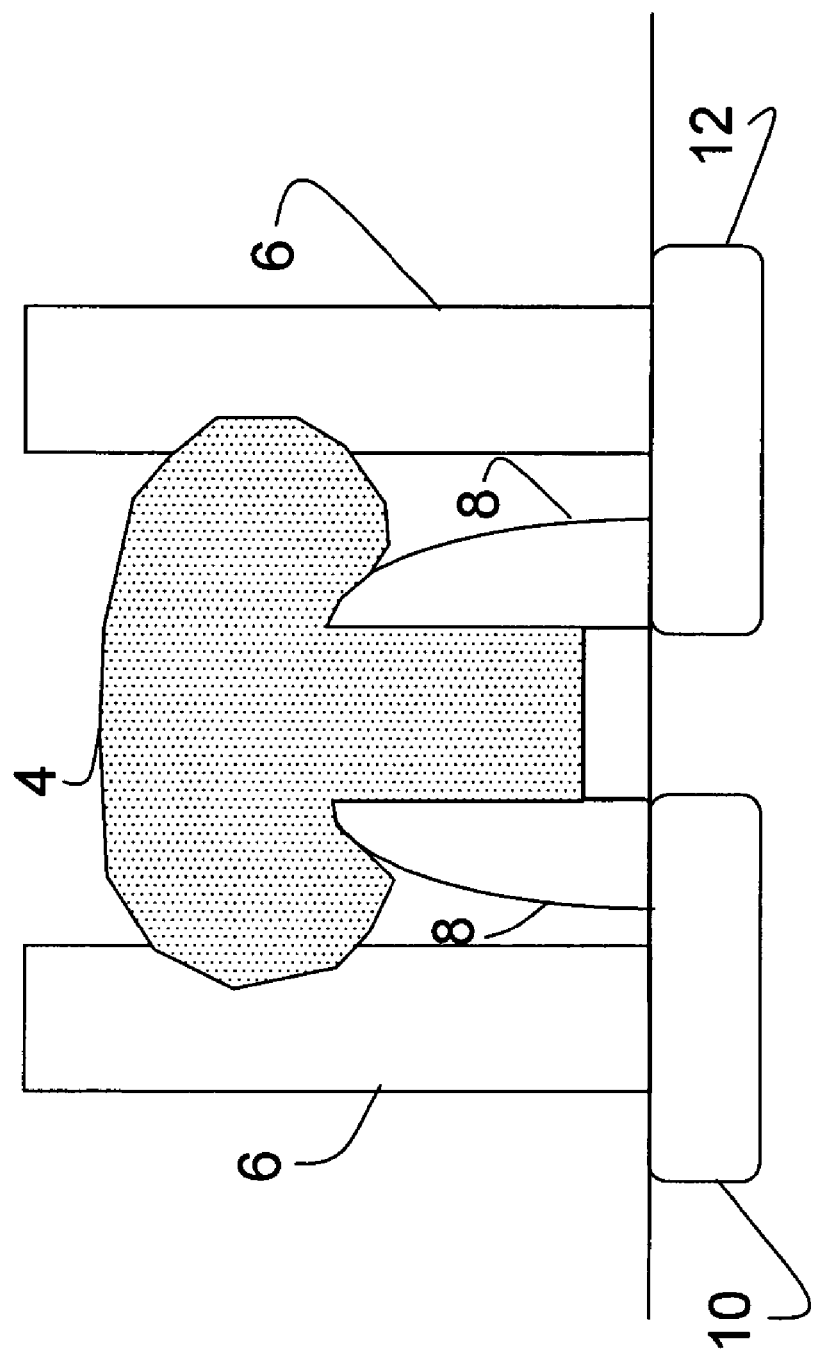
FIG. 1 schematically illustrates a problem that can occur when forming a fully silicided gate.

FIG. 1 shows a two-dimensional schematic cross-section of a stack of a first layer 14 comprising at least one semiconductor material, having thickness $t_{SC}$ and of a second layer 16 comprising at least one metal material, having thickness $t_{MO}$. The thickness of the second layer 16 and the first layer 14 are chosen so that substantially all of the first layer 14 is consumed upon silicidation.

The first layer 14 may comprise silicon, germanium, silicon-germanium, or a combination thereof. The second layer 16 may comprise refractory metals such as tungsten (W), Tantalum (Ta), noble metals such as platinum (Pt), near noble metals such as nickel (Ni), transition metals such as titanium (Ti), cobalt (Co), palladium (Pd), or any combination thereof.

When providing sufficient thermal energy to a stack comprising the layers 14, 16, substantially all semiconductor material in the first layer 14 with the metal material in the second layer 16 forming a silicided (or an alloy) layer 18 (dotted area) comprising alloy of both semiconductor and metal materials and a having thickness $t_{SIL}$. Thermal energy can be provided in one or two thermal process steps, such as Rapid Thermal Processing (RTP), spike anneal, and laser anneal, which are well known in the art. Any excess metal can be removed selectively to the silicided layer 18.

The volume of the silicided layer 18 may be larger than the volume of the first layer 14, as illustrated in FIG. 1 for a large thin layer: $t_{SIL} > t_{SC}$. The degree in which the volume of the silicided layer 18 increases with respect to the first layer 14 depends on the choice of semiconductor material and metal materials used to form the silicided layer 18, and on the silicide phase(s) in which this alloy layer is grown, as known from M. A. Nicolet et al in "VLSI electronics: Microstructure Science, Vol. 6", editors: N. G. Einspruch and G. B. Larrabee, Academic Press, New York, 1983, chapter 6, pages 455 to 459, hereby incorporated by reference.

This increase in thickness is proportional to the metal content of the silicided layer 18. If the silicided layer 18 comprises a nickel-silicide, which is formed by the reaction between nickel (i.e., the second layer 16) and silicon (i.e., the first layer 14), the expansion expressed by the thickness ratio $(t_{SIL}/t_{SC}) = (1+b)$ increases approximately from 1.1 (b=0.1) for NiSi to about 1.63 (b=0.63) for $Ni_2Si$ and to about 2.15 (b=0.15) for $Ni_3Si$. In the case of $Ni_3Si$, the thickness of the gate electrode increases approximately by a factor 2.15, while in case of PtSi, the volume increases approximately by a factor of 1.7. Consequently, if a silicon layer having a thickness $t_{SC}$=100 nm is fully consumed when forming a $Ni_3Si$ or PtSi silicide, the resulting silicide layer will have a thickness $t_{SIL}$ of respectively 215 nm and 170 nm.

As metal-rich suicides are preferably used to form a fully silicided gate electrode for pMOSFET devices, the problem electrical shorts caused by the volume expansion is more pronounced for pMOSFET devices. W. Maszara et al discloses in "Transistors with Dual Work Function Metal Gates by Single Full Silicidation (FUSI) of Polysilicon gates", IEDM proceedings 2002 p367-370, hereby incorporated by reference in its entirety, polycrystalline silicon and nickel to be combined to form nickel-silicide. Various phases can be obtained; such as NiSi, $Ni_3Si_2$, $Ni_2Si$, $Ni_{31}Si_{12}$ and $Ni_3Si$ phase, depending on the amount of nickel deposited.

Figure 3A:
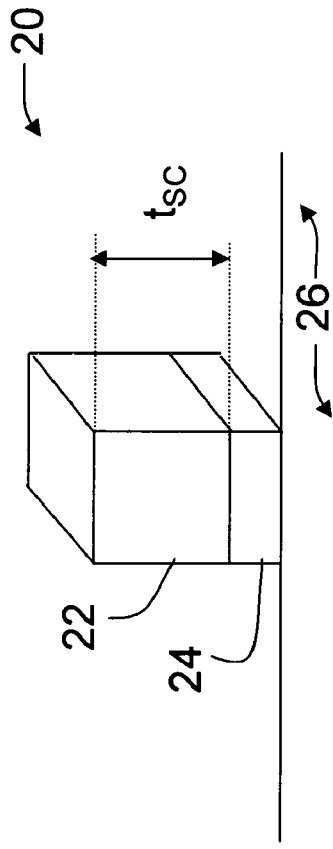
FIGS. 3A-E show schematic cross-sections illustrating a method for manufacturing a fully silicided MOSFET, according to an example.
Figure 3B:
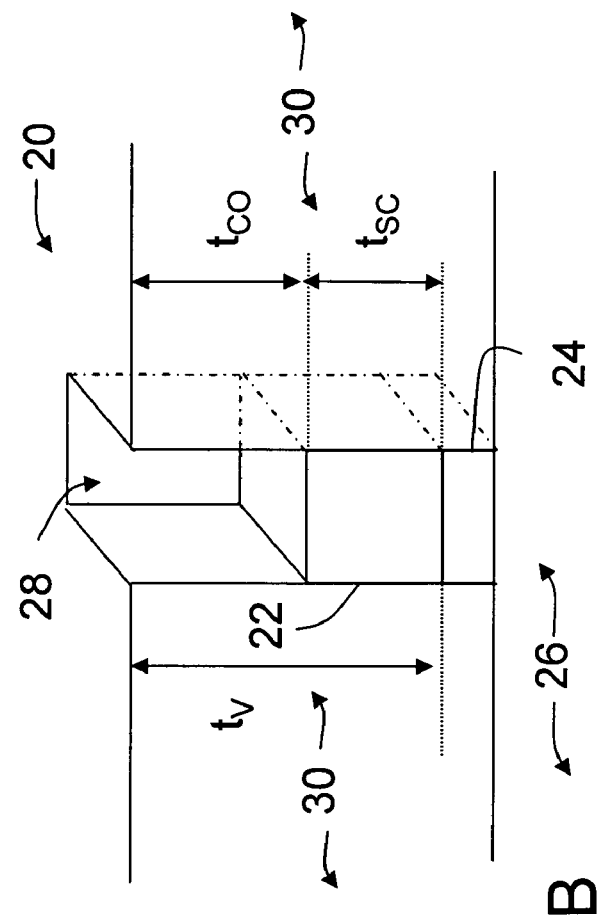

FIGS. 3A-D illustrate a method for manufacturing a fully silicided MOSFET. As shown in FIG. 3A, a MOSFET device 20 is provided, comprising a gate electrode 22 and a gate dielectric 24, which separates the gate electrode 22 from a substrate 26. The gate electrode 22 comprises a semiconductor material and has a thickness $t_{SC}$. In FIG. 3B, a container 28 is created above an exposed surface of the gate electrode 22. The container 28 is defined by the gate electrode 22 and by the walls of a dielectric layer or stack of dielectric layers 30 surrounding at least the gate electrode 22 and extending from above the gate electrode 22 to a height $t_V$.

Figure 3C:
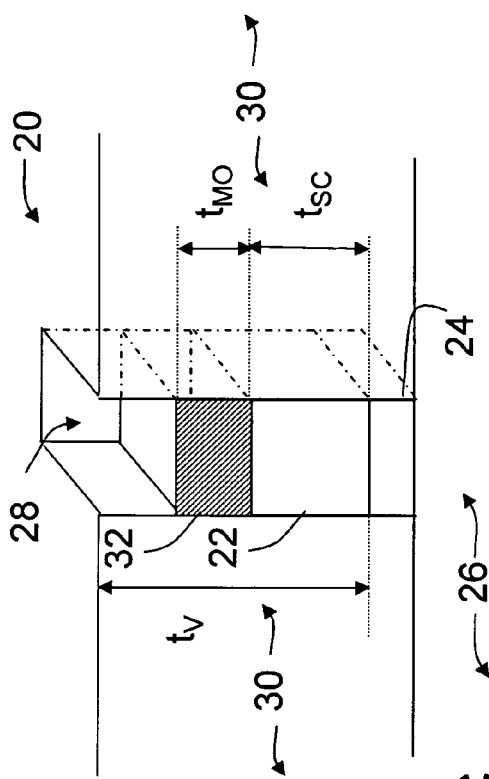

As shown in FIG. 3B, a volume is created having an opening opposite the substrate 26 and bordered by the dielectric layer 30 and the gate dielectric 24. This volume has a height $t_V = t_{SC} + t_{CO}$ and is only partially filled with the gate electrode 22 semiconductor material. FIG. 3C shows a silicidation metal 32 deposited on the exposed surface of the gate electrode 22. The silicidation metal 32 has a thickness $t_{MO}$. As shown, the silicidation metal 32 only partially fills the container 28; however, in alternative examples, the metal silicidation metal 32 may also completely fill or overfill the container 28.

Figure 3D:
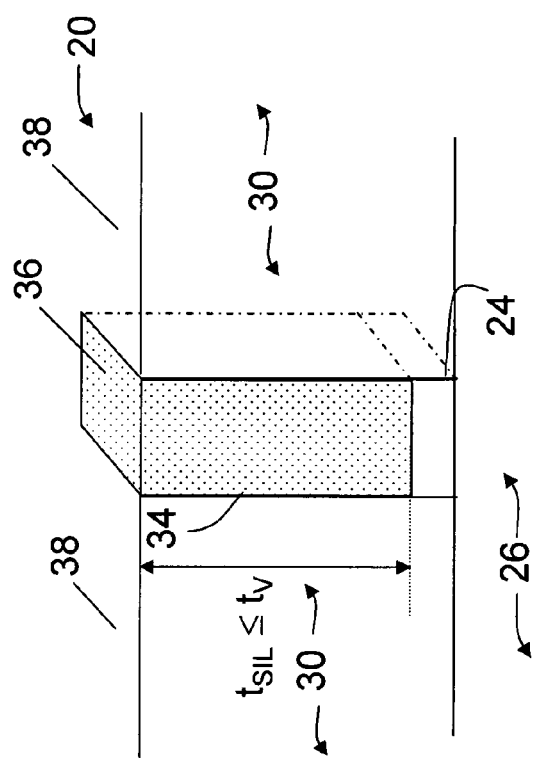

By providing sufficient thermal energy, the silicidation metal 32 and the semiconductor material of the gate electrode 22 react forming a silicide. FIG. 3D shows such a silicide 34, which may be formed using a one-step or a two-step silicide process. In a one-step silicide process, only one thermal process step (e.g., by RTP) is performed during which substantially all the semiconductor material within a layer is converted into a silicide. Subsequently a selective wet etch is performed to remove any unreacted refractory metal.

In a two-step silicide process, all or part of the semiconductor material within a layer is converted into a silicide in a first thermal process step. Subsequently, a selective wet etch is performed to remove any unreacted refractory metal. Thereafter, in the second thermal process step, the silicide reaction is continued to either convert substantially all of the semiconductor material in a layer into a silicide, just in case a complete silicide was not formed during the first thermal step or to change the silicide phase in a fully silicided layer. Due to the confinement by the dielectric layer 30, the volume expansion is essentially an expansion in a direction away from the substrate 26.

As shown in FIG. 3D, the silicide 34 has a thickness $t_{SIL}$. The dimensions of the container 28, and hence of the volume (described above) are chosen such that substantially all the silicide 34 is contained within the volume. An exposed surface 36 of the silicide 34 is at a level equal to or below the level of an exposed surface 38 of the dielectric layer 30.

Typically, the silicidation metal 32 is not fully consumed during full silicidation of the gate electrode 22. Typically, about 10% metal in excess is deposited than is needed in order to ensure that a sufficient amount of metal is available to convert substantially all of the gate electrode 22 into the silicide 34. This excess or unreacted metal is selectively removed after silicidation.

Figure 3E:
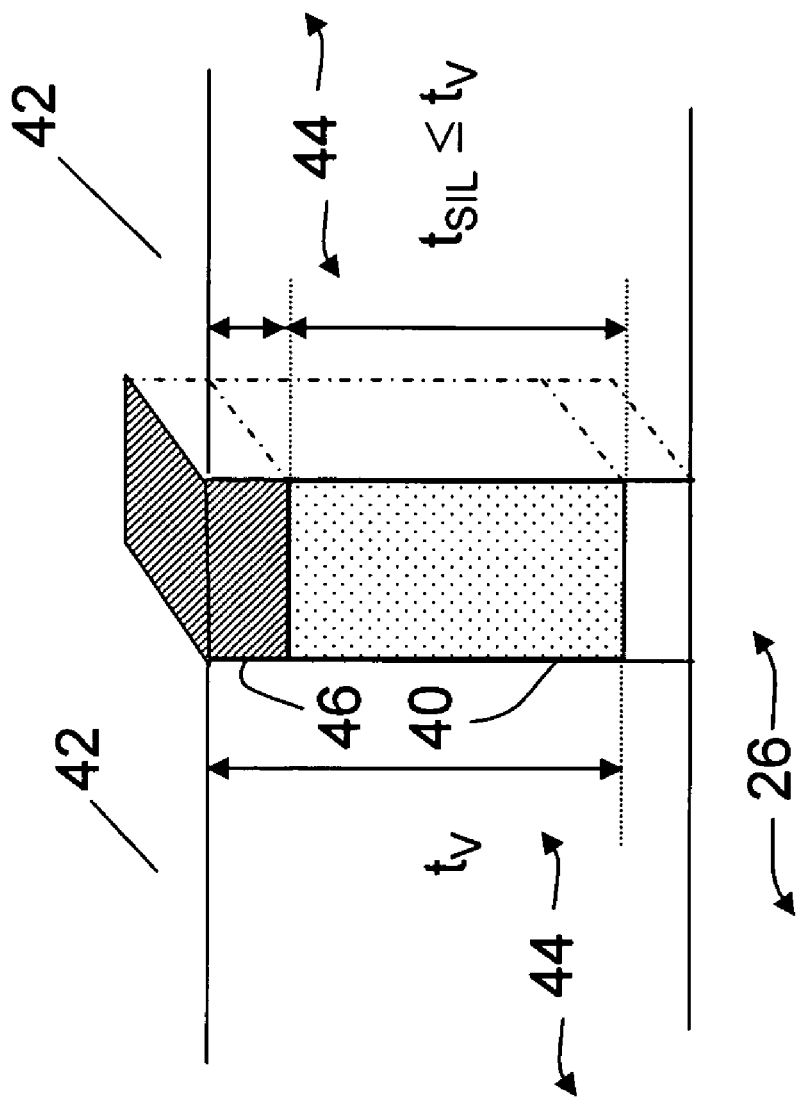

In FIG. 3E, an exposed surface of a silicide 40 is at a level below the level of an exposed surface 42 of a dielectric layer 44. An unreacted metal 46 ($t_{ME}$) on top may be selectively removed, exposing the upper surface of a fully silicided gate electrode that comprises the silicide 40. Several examples are described: if about 170 nm ($t_{MO}$) of nickel is deposited on about 100 nm ($t_{SC}$) poly silicon, about 215 nm ($t_{SIL}$) of Ni$_3$Si is formed after full silicidation, or if about 109 nm ($t_{MO}$) of nickel is deposited on about 100 nm ($t_{SC}$) polysilicon, about 163 nm ($t_{SIL}$) of Ni$_2$Si is formed after full silicidation.

In order to obtain silicide containment, the following relationships are obtained to correctly dimension a container, such as the container 28 or a container which comprises the silicide 40 and the unreacted metal 46:

$$t_V = t_{SC} + t_{MO} \geq t_{SIL} = t_{SC}(1+b) \quad [1]$$

$$t_{MO} \geq b t_{SC} \quad [2]$$

where (1+b) is the volume expansion factor of the silicide formed and ($bt_{SC}$) is the silicide layer thickness in excess of the semiconductor layer thickness $t_{SC}$.

As explained above, the value of b is determined by the choice of metal(s) and semiconductor material(s), and the silicide phase to be formed. In the MOSFET device 20 shown in FIGS. 3A-D, only the dimension perpendicular to the substrate 26 is used as parameter for dimensioning the container 28 and hence the volume. In this example, the area of the container 28 in a plane parallel to the substrate 26 equals the area of the gate electrode 22 as the sidewalls of the container 28 are aligned to the sidewalls of the gate electrode 22. Preferably, the silicides are formed with an expansion factor (1+b) greater than 1.

Figure 4E:
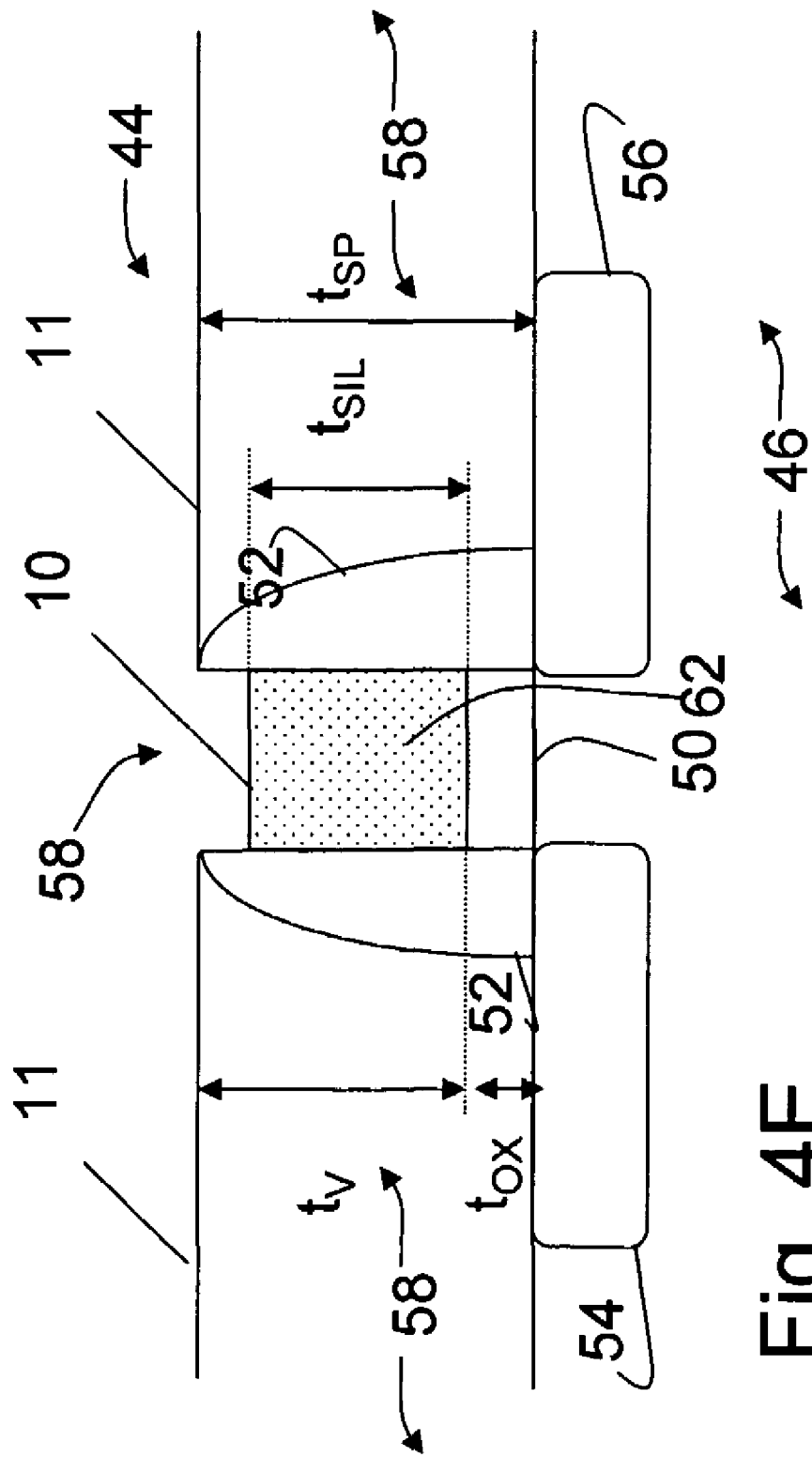

FIGS. 4A-E schematically illustrates an example process flow. FIG. 4A shows a MOSFET device 44 formed on a substrate 46 comprising a gate electrode 48; a gate dielectric 50 in-between the gate electrode 48 and the substrate 46; sidewall spacers 52 comprising a dielectric material adjacent to a stack comprising the gate electrode 48 and gate dielectric 50; source 54 and drain 56 junction regions aligned to the stack and extending underneath the sidewall spacers 52. The MOSFET device 44 shown in FIG. 4A may be any type of Metal-Oxide-Semiconductor Field-Effect-Transistor (MOSFET), such as a bulk transistor or a Multiple Gate transistor (MuGFET).

The gate dielectric 50 may comprise a silicon-oxide, a silicon-oxynitride, or a high-k dielectric, such as a hafnium-oxide or a hafnium-silicate. The gate electrode 48 is formed from a semiconductor material such as silicon, silicon-germanium, or germanium. As shown in FIG. 4A, the gate electrode 48 of the MOSFET device 44 is preferably formed of a semiconductor material such as polycrystalline silicon or polycrystalline Si$_x$Ge$_y$.

The substrate 46 may comprise a bulk semiconductor substrate, such as silicon or a germanium; or a semiconductor-on-insulator substrate, such as Silicon-On-Insulator (SOI) or Germanium-In-Insulator (GeOI).

The sidewall spacers 52 alongside the gate stack of the gate electrode 48 and the gate dielectric 50 are formed by depositing a conformal layer or stack of layers of dielectric material over the stack and by anisotropic etch of the dielectric layer(s) until the gate electrode 48 is exposed. Typically, silicon-oxide, silicon-oxynitride, or silicon-carbide materials are conformally deposited and etched using a dry etch such as a reactive ion etch (RIE) or etch plasma.

The height $t_{SP}$ of the sidewall spacers 52 is determined by the height of the stack comprising the gate electrode 48 and the gate dielectric 50: $t_{SP} = t_{OX} + t_V$. A volume is formed by creating the sidewall spacers 52 adjacent the gate electrode 48. The volume has as surfaces the sides of the spacers 52 and of the gate dielectric 50 (where the gate dielectric 50 is adjacent to the gate electrode 48). The volume is completely filled with the material that the gate electrode 48 comprises.

In FIG. 4B, a dielectric layer stack 58 is deposited over the MOSFET device 44. This dielectric layer stack 48 is shown as planarized by chemical mechanical polishing until the gate electrode 48 is exposed.

In FIG. 4C, the gate electrode 48 is partially thinned by a selective etch back of the semiconductor material(s) until a semiconductor layer having a predetermined thickness $t_{SC}$ is left and a container 58 having a height $t_{CO}$ is created. One way of dimensioning a volume is given below. In correspondence with relationship [1] $t_V = t_{SC} + t_{CO}$ and relationship [2] $t_{CO} \geq b$ $t_{SC}$, the volume height $t_V$ is determined in order to obtain a full silicidation of the gate electrode 48 having the desired thickness $t_{SIL}$ and being substantially contained within the spacers 52.

By selecting the silicide to be formed, the volume expansion factor (1+b) is determined. Next the spacer height is defined $t_{SP} = t_V + t_{OX}$. For devices having a gate dielectric thickness $t_{OX}$ of about 2 nm or less, for example, one can neglect the thickness $t_{OX}$ when determining the height of a volume: $t_{SP} = t_V$. The spacer height needed determines the thickness of the as-deposited gate dielectric 48. For the selected silicide thickness $t_{SIL}$ and a volume height $t_V$, one can determine the thickness $t_{SC}$ of the semiconductor layer that is to remain: $t_{SC} = t_{SIL}/(1+b)$ and, hence, the thinning $t_{CO}$ of the as-deposited layer.

In FIG. 4D, a metal layer 60 is deposited. The metal layer 60 has a thickness $t_{MO}$. In FIG. 4E, the semiconductor material within the gate electrode 48 and the metal layer 60 have reacted to form a silicide 62 having a thickness $t_{SIL}$. By appropriate thinning of the gate electrode 48 until reaching the predetermined thickness $t_{SC}$, a container 58 is formed which can accommodate the volume expansion b of the silicide: $t_{CO} \geq b$ $t_{SC}$. As shown in FIG. 4E, the silicide 62 comprises a FUSI gate electrode, which is fully contained within the sidewall spacers 52: $t_V = t_{SC} + t_{CO} > t_{SIL} = t_{SC}$ (1+b).

FIGS. 5A-C schematically illustrates another example process flow. A MOSFET device 64 shown in FIG. 5A differs from the MOSFET device 44 shown in FIG. 4A in that a gate electrode is fabricated using a mask layer 66 and a semiconductor layer 67 having thicknesses of $t_{CO}$ and $t_{SC}$, respectively, which can be determined by following the previously described procedure or by using the relationships [1] and [2].

The layers 66, 67 are formed in different materials, which are selected such that the mask layer 66 can be selectively removed. The semiconductor layer 67, which is in contact with a gate dielectric 68, comprises a semiconductor material, while the mask layer 66 may comprise a dielectric or a semiconducting material that may be selectively removed with respect to the semiconductor layer 67.

The gate electrode can be formed by uniformly depositing the layers 66, 67 on a substrate 70 and by patterning the layers 66, 67 to form the gate electrode. Optionally, source 72 and drain 74 regions may be silicided to form respective silicide portions 76 and 78, if care is taken that the mask layer 66 is not affected. The mask layer 66 is exposed and is either composed of a materials that do not react with a metal that is deposited for the gate electrode silicidation, such as dielectric materials (e.g., silicon-nitride, silicon-oxide, and silicon-carbide), or is formed from a semiconductor material, such as silicon-germanium or germanium, but is dimensioned to only partially consume when forming the silicide regions 76, 78. The silicide formed at the gate electrode during this process step should not extend to the semiconductor layer 67.

In FIG. 5B, a dielectric layer stack 80 is deposited over the MOSFET device 64. This dielectric layer stack 80 is planarized by chemical mechanical polishing until the mask layer 66 is exposed. The dielectric layer stack 80 masks the source 72 and drain 74 regions when fully siliciding the gate electrode.

In FIG. 5C, the mask layer 66 is selectively removed such that the semiconductor layer 67 is exposed. Preferably, the mask layer 66 is formed from silicon-germanium, while the semiconductor layer 67 is formed from polycrystalline silicon. A dry etch process may be used to remove the a silicon-germanium plug (i.e., the mask layer 66) so that the semiconductor layer 67 has a remaining thickness $t_{SC}$ remains and a container 82 is created having the predetermined height $t_{CO}$.

In FIG. 5D, a layer of material 84 having thickness $t_{MO}$ is uniformly deposited over the substrate. Preferably, this layer is a nickel layer. Preferably, the MOSFET device 64 is heated in a first thermal process step, such as RTP, to form a metal-rich fully silicided gate electrode in the case in which the MOSFET device 64 is a pMOSFET and a metal-rich partially silicided gate electrode in the case in which the MOSFET device 64 is an nMOSFET.

Figure 5E:
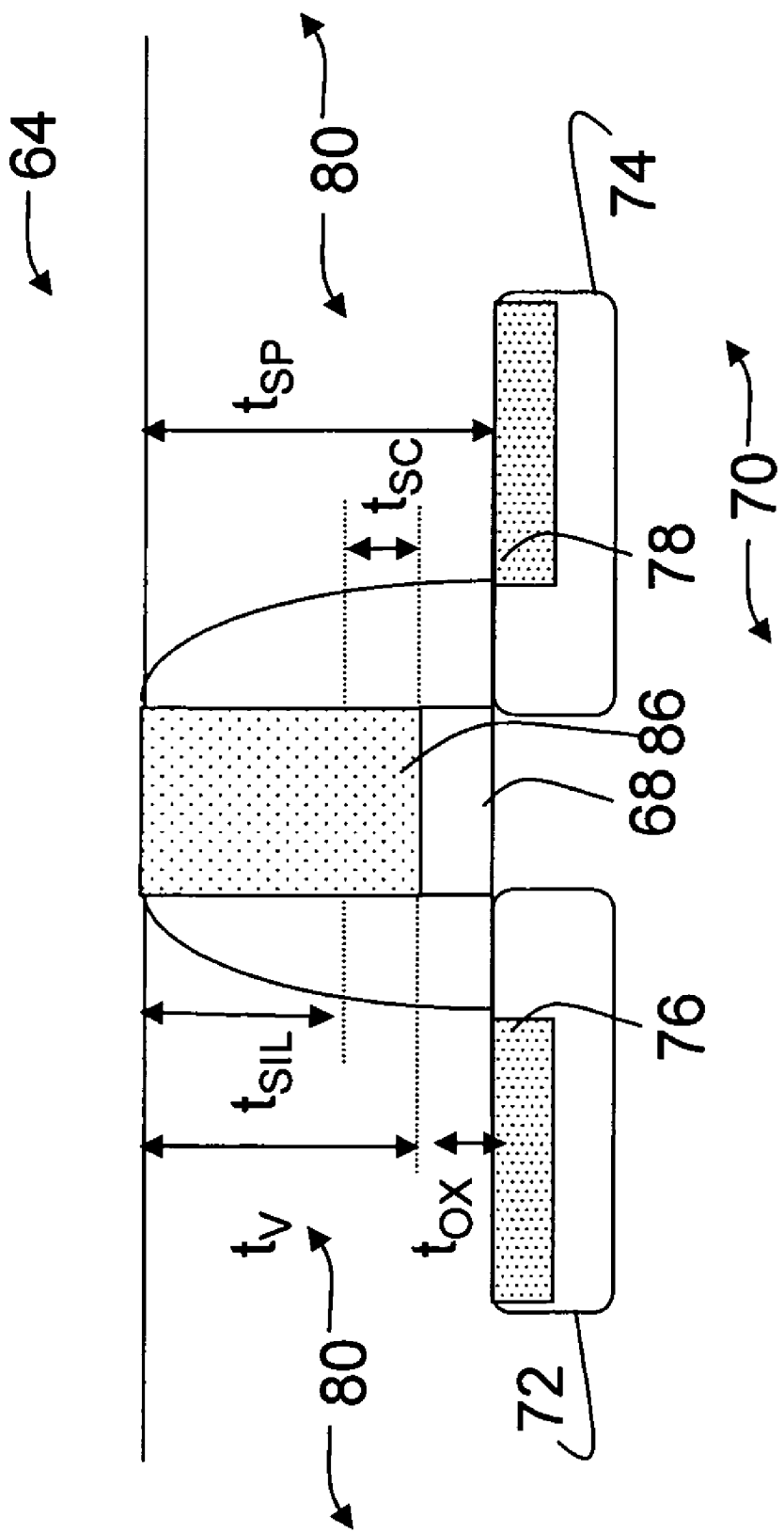

Unreacted metal is removed yielding the MOSFET device 64 shown in FIG. 5E. The MOSFET device 64 comprises a gate electrode 86. The silicidation process is completed by a second thermal process step, such as RTP, in which in a partially silicided nMOSFET the gate electrode becomes fully silicided.

The invention claimed is:

1. A method of manufacturing at least one MOSFET device having a fully silicided gate electrode, comprising:
   providing a gate stack of a gate dielectric and a semiconductor layer having a thickness $t_V$, wherein at least a portion of the semiconductor layer in contact with the gate dielectric comprises a semiconductor material, and wherein a sidewall of the semiconductor layer is wrapped by a dielectric layer;
   removing a portion of the semiconductor layer so that the semiconductor layer has a thickness $t_{SC}$;
   depositing a layer of at least one silicidation metal on the semiconductor layer; and
   fully siliciding the semiconductor layer to form a silicide with a thickness $t_{SIL}$, wherein $t_V$ and $t_{SC}$ are selected according to a relationship $t_V \geq t_{SIL} = t_{SC}(1+b)$, where $(1+b)$ is a volume expansion factor of the silicide.

2. The method of claim 1, wherein providing the gate stack comprises:
   forming a stack of the gate dielectric and the semiconductor layer, and
   forming a dielectric layer adjacent to a sidewall of the stack of the gate dielectric and the semiconductor layer.

3. The method of claim 2, wherein forming a dielectric layer against the stack of the gate dielectric and the semiconductor layer comprises forming sidewall spacers adjacent to the stack of the gate dielectric and the semiconductor layer.

4. The method of claim 1, wherein removing a portion of the semiconductor layer comprises thinning the semiconductor to the thickness $t_{SC}$.

5. The method of claim 4, wherein the semiconductor layer comprises silicon.

6. The method of claim 1, wherein the metal layer comprises nickel.

7. A method of manufacturing at least one MOSFET device having a fully silicided gate electrode, comprising:
   providing a gate stack of a gate dielectric comprising a semiconductor material, a semiconductor layer having a thickness $t_{SC}$, and a mask layer, wherein the semiconductor layer is interposed between the gate dielectric and the mask layer and at least a portion of the semiconductor layer is in contact with the gate dielectric, and wherein a sidewall of the semiconductor layer is wrapped by a dielectric layer;
   removing the mask layer so as to expose a surface of the semiconductor layer, wherein the mask layer is selectively removable with respect to the semiconductor layer;
   depositing a layer of at least one silicidation metal on the semiconductor layer; and
   fully siliciding the semiconductor layer to form a silicide with a thickness $t_{SIL}$, wherein $t_V$ and $t_{SC}$ are selected according to a relationship $t_V \geq t_{SIL} = t_{SC}(1+b)$, where $(1+b)$ is a volume expansion factor of the silicide.

8. The method of claim 1, wherein the semiconductor layer comprises silicon.

9. The method of claim 1, wherein the mask layer comprises $Si_xGe_y$.

10. A method of manufacturing a MOSFET device having a fully silicided gate electrode, comprising:
    providing a semiconducting gate having a thickness $t_{SC}$;
    forming a container having dielectric sidewalls on the semiconductor gate and aligned thereto, wherein the container has a height $t_{CO}$;
    depositing a layer of at least one silicidation metal on the semiconducting gate; and
    fully siliciding the semiconducting gate to form a silicide having a thickness $t_{SIL}$, wherein $t_{CO}$ and $t_{SC}$ are selected according to a relationship $t_{CO} \geq (t_{SC} b)$, where $t_{SIL}/t_{SC} = (1+b)$ is a volume expansion factor of the silicide formed.

* * * * *